(12) United States Patent
Denda

(10) Patent No.: US 7,847,903 B2
(45) Date of Patent: Dec. 7, 2010

(54) PIXEL ELECTRODE, METHOD FOR FORMING THE SAME, ELECTROOPTICAL DEVICE, AND ELECTRONIC APPARATUS

(75) Inventor: Atsushi Denda, Chino (JP)

(73) Assignee: Seiko Epson Corporation (JP)

( * ) Notice: Subject to any disclaimer, the term of this patent is extended or adjusted under 35 U.S.C. 154(b) by 1231 days.

(21) Appl. No.: 11/420,295

(22) Filed: May 25, 2006

(65) Prior Publication Data

US 2006/0268210 A1    Nov. 30, 2006

(30) Foreign Application Priority Data

May 27, 2005    (JP) .............................. 2005-155002

(51) Int. Cl.
*G02F 1/1343* (2006.01)
(52) U.S. Cl. ....................... 349/140; 349/139; 349/147; 349/187
(58) Field of Classification Search ................. 349/138, 349/139–140, 147, 187
See application file for complete search history.

(56) References Cited

U.S. PATENT DOCUMENTS

| | | | |
|---|---|---|---|
| 7,136,127 B2 * | 11/2006 | Furusawa | .................... 349/138 |
| 2003/0193624 A1 * | 10/2003 | Kobayashi et al. | ............ 349/42 |
| 2004/0004678 A1 | 1/2004 | Furusawa | |

FOREIGN PATENT DOCUMENTS

| | | |
|---|---|---|
| JP | 09-194233 | 7/1997 |
| JP | 2003-318131 | 11/2003 |
| JP | 2005-013985 | 1/2005 |
| JP | 2005-064034 | 3/2005 |
| WO | WO 2005/048354 | 5/2005 |

OTHER PUBLICATIONS

Communication from European Patent Office re: related application, Sep. 18, 2006.

* cited by examiner

*Primary Examiner*—David Nelms
*Assistant Examiner*—Nathanael R Briggs
(74) *Attorney, Agent, or Firm*—Harness, Dickey & Pierce, P.L.C.

(57) ABSTRACT

A method for forming a pixel electrode on a substrate, including: forming a bank corresponding to a region for forming the pixel electrode on a substrate; disposing, by a liquid ejection method, a first functional liquid containing transparent conductive microparticles in the region partitioned by the bank; drying the first functional liquid to produce a first layer film; disposing, by a liquid ejection method, a second functional liquid containing a silicon compound onto the first layer film; and forming a pixel electrode made of a laminate that includes: a transparent conductive layer which is formed by calcining together the first layer film and the second functional liquid and is composed of the first layer film and silicon oxide filling a pore in the first layer film; and a silicon oxide layer formed on the transparent conductive layer.

6 Claims, 9 Drawing Sheets

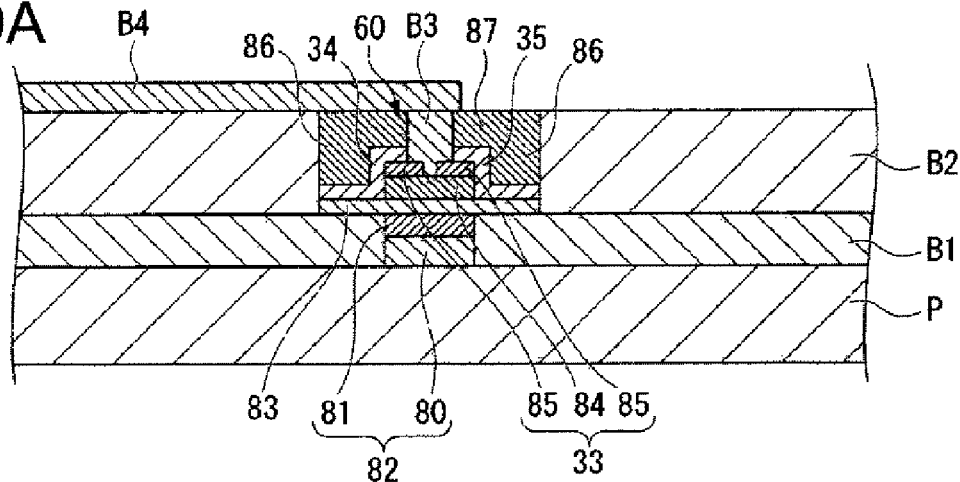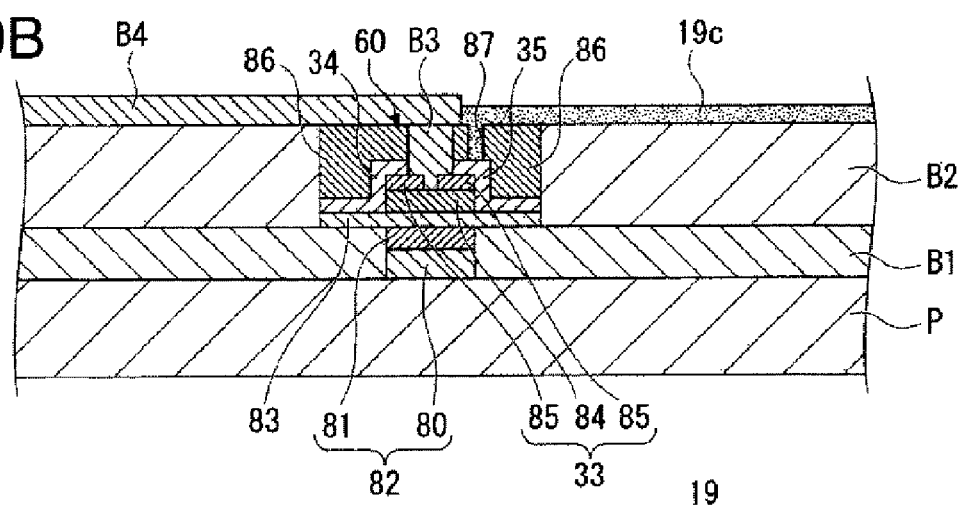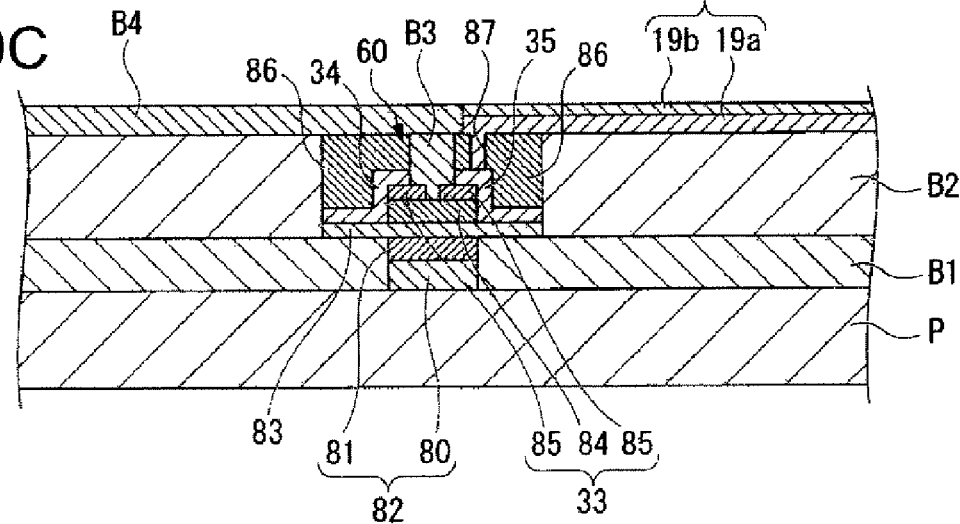

PIXEL ELECTRODE, METHOD FOR FORMING THE SAME, ELECTROOPTICAL DEVICE, AND ELECTRONIC APPARATUS

BACKGROUND

1. Technical Field

The present invention relates to a transparent pixel electrode used mainly for an electrooptical device, a manufacturing method therefor, an electrooptical device having the pixel electrode, and an electronic apparatus.

2. Related Art

When forming a pixel electrode on the display side of an electrooptical device such as a liquid crystal display device, a transparent conductive film composed of indium tin oxide (ITO) or the like is used to form the pixel electrode since it is necessary to transmit light through the pixel electrode. When forming such a transparent conductive film made of ITO, vapor phase methods such as sputtering and deposition are generally used.

In the vapor phase method such as the sputtering or the like, patterning is required after forming the film, and the patterning is carried out generally using photolithography. However, the patterning using photolithography suffers high manufacturing cost and low productivity, since an extensive set of equipment such as a vacuum device is needed for the film formation and etching processes, and since the material usability is only several percent, indicating that most of the material ends up being discarded Under the circumstances, techniques for forming the transparent conductive film by a liquid phase method are proposed. For example, the transparent conductive film is formed by: dispersing ITO microparticles in resin and an organic solvent; coating the obtained dispersion liquid by a coating method or a printing method such as dip coating, spin coating, floating, screen printing, gravure coating, or offset printing; and further drying and calcining the coated dispersion liquid (e.g., JP-A-09-194233). According to this method, since the film made particularly of the ITO microparticles has pores, a metal oxide film is formed in order to fill the pores so that gas or moisture does not readily affect the film and changes its conductivity (specific resistance).

However, when forming the transparent pixel electrodes (transparent conductive film) on the substrate side having transistors (e.g., TFTs made of amorphous silicon) formed thereon, there are problems particularly as follows.

By the coating method such as dip coating, spin coating, or floating, a mixed film of ITO microparticles and metal oxide is formed on the entire surface, and, therefore, it is not possible to carry out fine patterning (etching). This is because the ITO film is wet-etched normally using an acid-based etching liquid and patterned, while a silicon oxide as the metal oxide is wet-etched using, for example, a fluorine-based etching liquid and patterned, and, thus, there is no etching liquid that can suitably etch the mixed film of the ITO film and the silicon oxide film.

Further, by the printing method such as the screen, gravure, or offset printing, it is difficult to form a metal oxide layer on an already patterned ITO while suitably covering its side edge surfaces. If the transparent electrode (the transparent conductive film) is formed without the side edge surfaces being covered, moisture absorption occurs from the side edge surfaces of the film, and the conductivity (the specific resistance) changes. In contrast, in order to suitably cover the side edge surfaces, it is possible to thickly form the metal oxide layer. In this case, however, the surface resistance of the transparent electrode increases because of the presence of the metal oxide layer, and the transmittance of the transparent electrode decreases.

SUMMARY

An advantage of the invention is to provide a transparent pixel electrode and a manufacturing method therefor, which enables fine patterning for the pixel electrode and which prevents property changes and transmission decrease at the pixel electrode caused by gas and moisture, an electrooptical device having the pixel electrode, and an electronic apparatus.

According to a first aspect of the invention, a method for forming a pixel electrode on a substrate includes: forming a bank corresponding to a region for forming the pixel electrode on a substrate; disposing, by a liquid ejection method, a first functional liquid containing transparent conductive microparticles in the region partitioned by the bank; drying the first functional liquid to produce a first layer film; disposing, by a liquid ejection method, a second functional liquid containing a silicon compound onto the first layer film; and forming a pixel electrode made of a laminate that includes: a transparent conductive layer which is formed by calcining together the first layer film and the second functional liquid and is composed of the first layer film and silicon oxide filling a pore in the first layer film; and a silicon oxide layer formed on the transparent conductive layer.

In this case, the first functional liquid and the second functional liquid are successively disposed by the liquid ejection method in the region partitioned by the bank so as to form the pixel electrode. Thus, by forming the bank corresponding to a desired pixel electrode pattern in advance, the pixel electrode may be patterned and formed with precision despite the fineness of the pattern.

Further, since the pixel electrode is formed in the bank, the side edge surfaces of the pixel electrode, in particular, are covered by the bank, and, therefore, it becomes possible to suppress the conductivity change in the pixel electrode caused by the moisture absorption at the side edge surfaces without accompanying the transmission decrease.

It is preferable that the first layer film obtained by the drying process has a thickness of 400 nm or less.

In this case, the obtained pixel electrode may have good transparency.

Also, it is preferable that the silicon oxide layer has a thickness of 10 nm or more and 100 nm or less.

In this case, if the thickness is less than 10 nm, the flatness of the silicon oxide layer decreases, and, thus, the transparency may decrease. If the thickness is greater than 100 nm, capacitance may be formed at the silicon oxide layer. Therefore, by keeping the thickness within the reference range, both the transmission decrease and the capacitance formation may be suppressed.

Furthermore, it preferable that a glass substrate is used as the substrate.

In this case, because the pixel electrode is formed by laminating the transparent conductive layer and the silicon oxide layer, in particular, and because the silicon oxide layer has substantially the same transmittance as that of glass, the pixel electrode itself may also have the transmittance close to that of glass. Consequently, because the refractive index between the pixel electrode and the glass substrate is sufficiently small, for example, the display performance of an electrooptical device may be enhanced if this specific pixel electrode is used in the electrooptical device.

According to a second aspect of the invention, a pixel electrode includes: a bank formed on a substrate; and a laminate provided in a region partitioned by the bank, the laminate including: a transparent conductive layer composed of a first layer film made of transparent conductive microparticles and a silicon oxide filling a pore in the first layer film; and a silicon oxide layer formed over the transparent conductive layer.

In this case, the pixel electrode is made of the laminate including the transparent conductive layer and the silica oxide layer covering this transparent conductive layer in the region partitioned by the bank. Thus, by forming the bank corresponding to a desired pixel electrode pattern in advance, the pixel electrode may be patterned and formed with precision despite the fineness of the pattern.

Further, since the transparent conductive layer and the silicon oxide layer are formed in the bank, the side edge surfaces of each of these layers are covered by the bank, and, therefore, it may be possible to suppress the conductivity change in the transparent conductive layer caused by the moisture absorption particularly from the side edge surfaces without accompanying the transmission decrease.

According to a third aspect of the invention, an electrooptical device includes the pixel electrode formed by the formation method or the pixel electrode.

In this case, because the pixel electrode can be miniaturized, the fine display by the electrooptical device may be possible. Further, since the conductivity change in the pixel electrode is suppressed without accompanying the transmittance decrease, the display may be stably performed.

According to a fourth aspect of the invention, an electronic apparatus includes the electrooptical device.

In this case, the electrooptical device may enable the electronic apparatus to perform fine and stable display.

BRIEF DESCRIPTION OF THE DRAWINGS

The invention will be described with reference to the accompanying drawings, wherein like numbers reference like elements.

FIGS. 7A and 713 are cross-sectional diagrams to explain processes of manufacturing the thin film transistor.

FIGS. 9A through 9C are cross-sectional diagrams to explain processes of manufacturing the thin film transistor.

DESCRIPTION OF EXEMPLARY EMBODIMENTS

Figure 1:
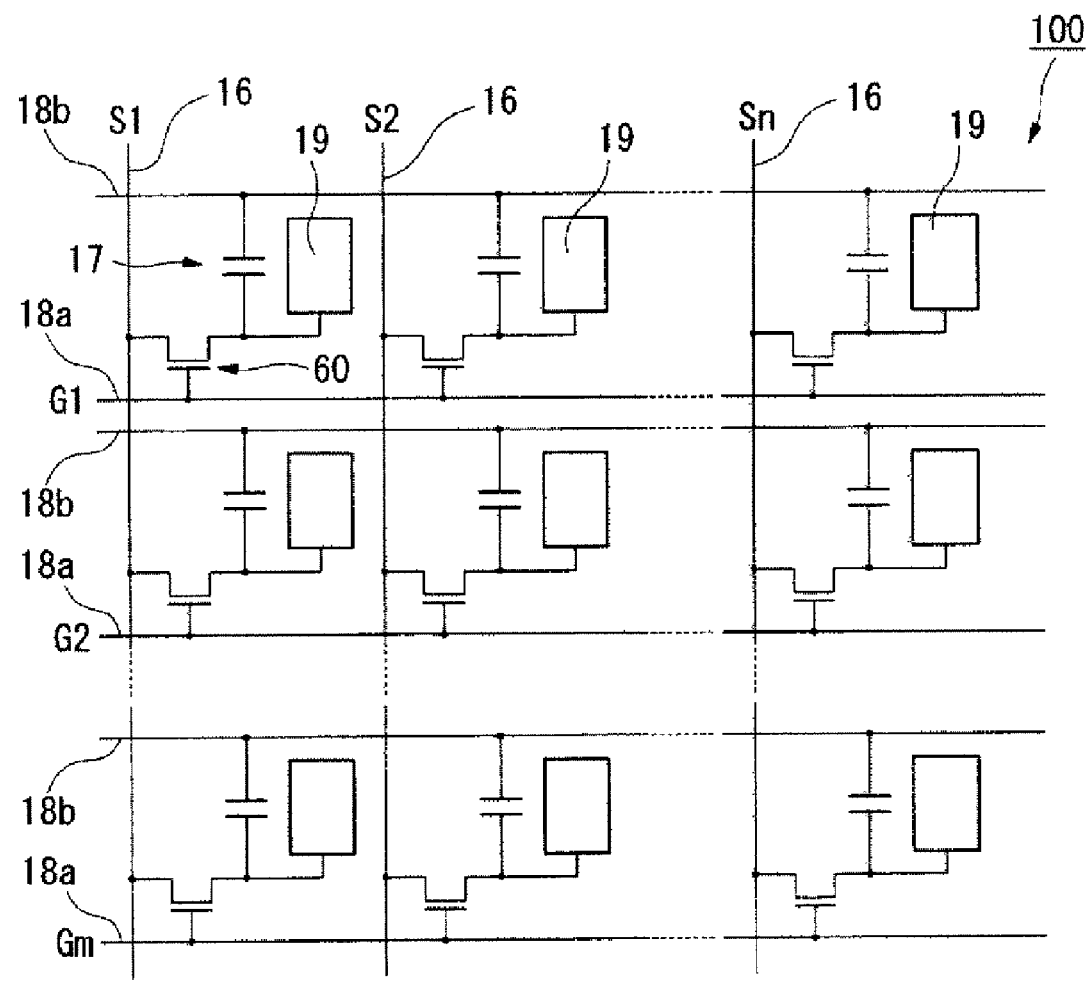
FIG. 1 is an equivalent circuit diagram of a liquid crystal display device according to one embodiment of the invention.

Embodiments of the invention will now be described with reference to the drawings. In each drawing, the scale of each layer or each member may differ so that they can be recognizable in the drawing.

Electrooptical Device

First, one working example of the electrooptical device of one embodiment of the invention will be described. FIG. 1 is an equivalent circuit diagram showing a liquid crystal display device 100, which is the working example of the electrooptical device of one embodiment of the invention. In this liquid crystal display device 100, a pixel electrode 19 and a TFT 60, as a switching element control this pixel electrode 19, are formed in each of a plurality of dots arranged in matrix constituting image display regions, and each data line (electrode wiring) 16 that receives an image signal is electrically coupled to the source of the TFT 60. Image signals S1, S2, . . . Sn to be written into the data lines 16 are either successively supplied to the data lines 16 in the order of from S1 to Sn or supplied per each group corresponding to the plurality of adjacent data lines 16. Also, a scanning line (electrode wiring) 18a is electrically coupled to the gate of the TFT 60, and scanning signals G1, G2, . . . Gm are applied line-sequentially in a pulse form to a plurality of scanning lines 18a at a predetermined timing. Further, the pixel electrodes 19 are electrically coupled to the drains of the TFTs 60 and, by keeping the switching elements TFTs 60 in an on state for a fixed period of time, write in the image signals S1, S1, . . . Sn supplied from the data lines 16 at a predetermined timing.

The image signals S1, S2, . . . Sn at the predetermined level written in liquid crystal through the pixel electrodes are held for a fixed period of time between the pixel electrodes and common electrodes mentioned below. Then, when light is modulated using the changes in the alignment and order of the molecular aggregates of the liquid crystal in response to the applied voltage level, it becomes possible to perform a given gradation display. Further, in order to prevent leakage of the image signals written in the liquid crystal, each dot is provided with a storage capacitor 70 in series with a liquid crystal capacity produced between the pixel electrode 19 and the common electrode. A reference number 18b indicates a capacitance line coupled to electrodes on one side of the storage capacitor 70.

Figure 2:
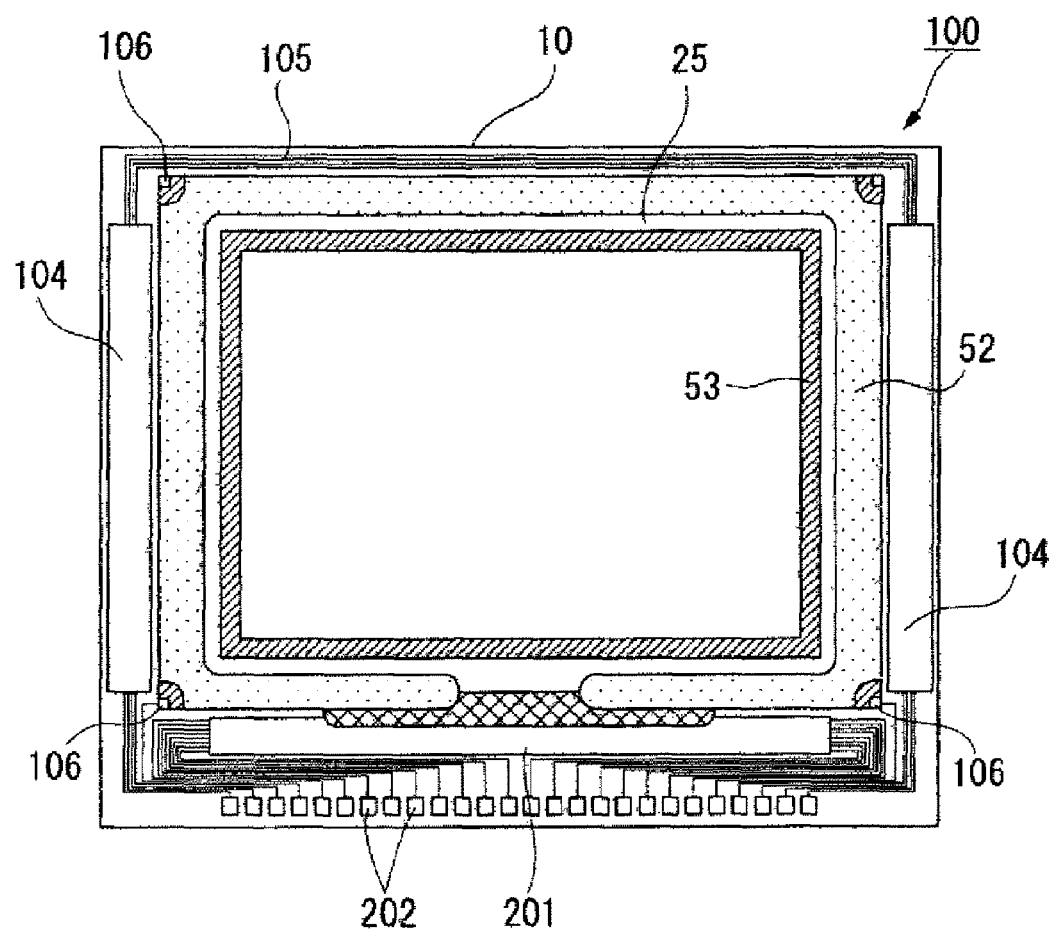
FIG. 2 is a plan diagram showing the whole structure of the liquid crystal display device.

Next, FIG. 2 is a diagram of the whole structure of the liquid crystal display device 100. The liquid crystal display device 100 has a structure in that a TFT array substrate 10 is adhered to an opposite substrate 25 with a sealant 52 having a shape of a planarly and substantially rectangular frame, and that the liquid crystal sandwiched between both of these substrates 10 and 25 is sealed between the substrates by the sealant 52. FIG. 2 shows that the outer circumferential edge of the opposite substrate 25 is planarly matched with the outer circumferential edge of the sealant 52.

In the inner region of the sealant 52, a light shielding film (of peripheral parting) 53 made of a light shielding material is formed in a rectangular frame shape. In the peripheral circuitry region outside the sealant 52, a data line drive circuit 201 and mount terminals 202 are arranged along one side of the TFT array substrate 10, and scanning line drive circuits 104 and 104 are disposed along two sides adjacent to this one side. A plurality of wires 105 connecting the scanning line drive circuits 104 and 104 are formed on the remaining side of the TFT array substrate 10. Further, on the corners of the opposite substrate 25, a plurality of inter-substrate conductive members 106 are disposed so as to electrically conduct the opposite substrate 25 with the TFT array substrate 10.

Figure 3:
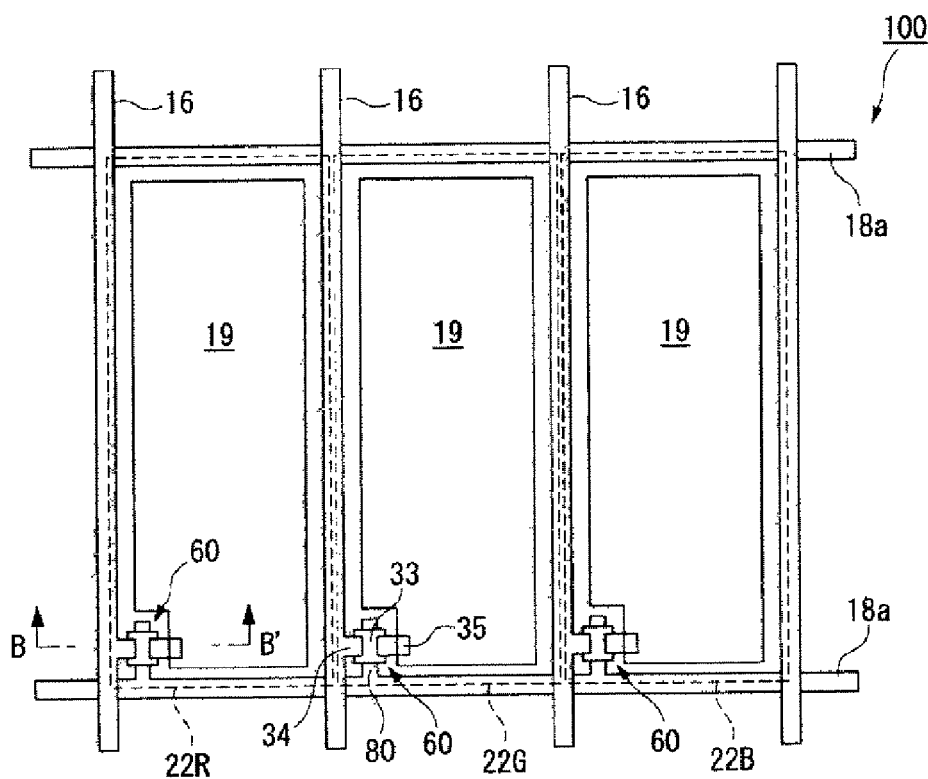
FIG. 3 is a plan diagram showing the structure of one pixel region of the liquid crystal display device.

Next, FIG. 3 is a diagram to explain the structure of a pixel of the liquid crystal display device 100, showing a plan pattern view of the structure. As shown in FIG. 3, in the display regions of the liquid crystal display device 100, the plurality of scanning lines 18 extend in one direction, and the plurality of data lines 16 extend in a direction intersecting the scanning lines 18. In FIG. 3, the planarly rectangular regions surrounded by the scanning lines and data lines 18a and 16 are the dot regions. A filter having one color out of the three primary colors is formed corresponding to one dot region, and the three dot regions, as shown, constitute one pixel region having coloring sections 22R, 22G, and 22B. These coloring sections 22R, 22G, and 22B are periodically arranged in the display region of the liquid crystal display device 100.

In each dot region shown FIG. 3, the planarly and substantially rectangular pixel electrode 19 made of a translucent conductive film such as indium tin oxide (ITO) is disposed, and the TFT 60 is arranged among the pixel electrode 19, the scanning line 18a, and the data line 16. The TFT 60 is composed of a semiconductor layer 33, a gate electrode layer 80 disposed on the lower layer side (the substrate side) of the semiconductor layer 33, a source electrode 34 disposed on the upper layer side of the semiconductor layer 33, and a drain electrode 35. In a region facing the semiconductor layer 33 and the gate electrode layer 80A, a channel region of the TFT 60 is formed, and a source region and a drain region are formed on the semiconductor layer at both sides of the channel region.

The gate electrode layer 80 is formed using part of the scanning line 18a that branches out in the direction that the data line 16 extends, with its tip portion opposing the semiconductor layer 33 via an insulation film (a gate insulation film; not shown) at right angles to the paper surface. The source electrode 34 is formed using part of the data line 16 that branches out in the direction that the scanning line 18a extends and is electrically coupled to the semiconductor layer 33 (the source region). One end (the left end in the drawing) of the drain electrode 35 is electrically coupled to the semiconductor layer 33 (the drain region), and the other end (the right end in the drawing) of the drain electrode 35 is electrically coupled to the pixel electrode 19.

Having the above structure, and when kept in the on state for a predetermined period of time by a gate signal input via the scanning line 18a, the TFT 60 functions as the switching element and writes the image signal supplied via the data line 16 into the liquid crystal at a predetermined timing.

Figure 4:
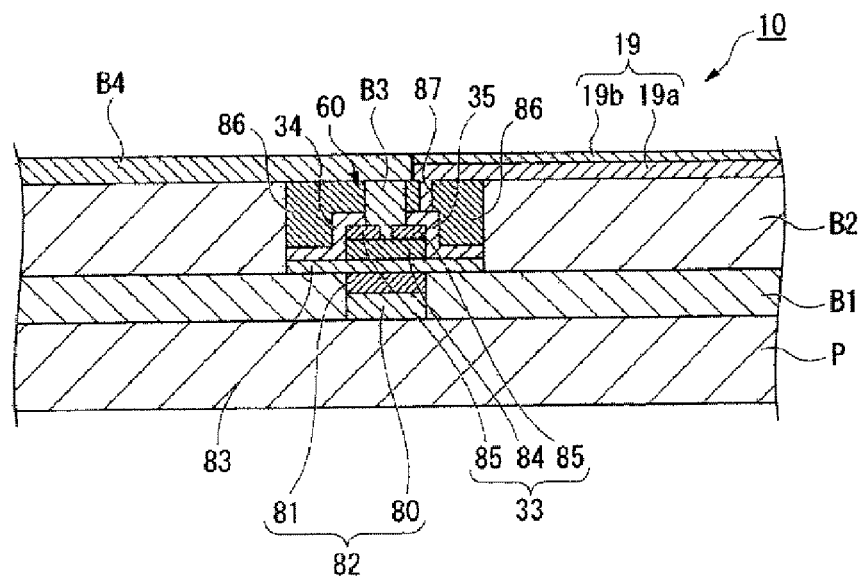
FIG. 4 is a cross-sectional diagram showing the structure of part of a TFT array substrate.

FIG. 4 is a cross-sectional diagram taken along the line B-B' of FIG. 3, showing the structure of the essential part of the TFT array substrate 10. As shown in FIG. 4, the TFT array substrate 10 includes the TFT 60 formed on the inner surface side (on the upper surface side in the drawing) of a glass substrate P and the pixel electrode 19 of one embodiment of the invention. A first bank B1 having an aperture is formed on the substrate P, and the gate electrode layer 80 and a cap layer 81 covering this gate electrode layer 80 are embedded in the aperture of the bank B1. The gate electrode layer 80 is formed on the glass substrate P using metal materials such as Ag, Gu, Al, etc. The cap layer 81 covers the gate electrode layer 80 to prevent diffusion of the metal constituting the gate electrode layer 80 and is made of such metal materials as Ni, Ti, W, Mn, etc. stacked on the gate electrode layer 80.

A second bank B2 is formed on the first bank B1, having an aperture exposing a region including the gate electrode layer 80 and the cap layer 81. In this aperture, a gate insulation film 83 made of silicon oxide, silicon nitride, or the like is formed, and the semiconductor layer 33 is formed on this gate insulation film 83 in a position planarly overlapping the gate electrode layer 80. The semiconductor layer 33 is composed of an amorphous silicon layer 84 and an N$^+$ silicon layer 85 stacked on this amorphous silicon layer 84. The N$^+$ silicon layer 85 is split into two planarly gapped portions on the amorphous silicon layer 84, where one N$^+$ silicon layer 85 is electrically coupled to the source electrode 34 formed over both the gate insulation film 83 and this N$^+$ silicon layer 85, and the other N$^+$ silicon layer 85 is electrically coupled to the drain electrode 35 formed over both the gate insulation film 83 and this N$^+$ silicon layer 85.

The source electrode 34 and the drain electrode 35 are separated by a third bank B3 formed in the aperture of the second bank B2 and are formed in a region partitioned, as will be described, by the second bank B2 and the third bank B3 by the liquid ejection method as will be described hereafter. Further, on the source electrode 34 and the drain electrode 35, an insulation material 86 is arranged so as to fill the aperture. Furthermore, on the second bank B2 and the insulation material 86, the pixel electrode 19 is formed in a region partitioned by a fourth bank B4. This pixel electrode 19 is the one working example of the pixel electrode of one embodiment of the invention and is composed of a transparent conductive layer 19a and a silicon oxide layer 19b formed over this transparent conductive layer 19a. The transparent conductive layer 19a is, as will be described, composed of a first layer film made of transparent conductive microparticles the silicon oxide filling the pores in this first layer film. Further, the pixel electrode 19 having such a structure is made to conduct with the drain electrode 35 via a contact hole 87 formed in the insulation material 86. The TFT 60 is formed having thus described structure.

Additionally, as shown in FIG. 3, because the data line 16 and the source electrode 34, and the scanning line 18a and the gate electrode layer 80, are both integrated, the data line 16 is covered by the insulation material 86 as is the source electrode 34, and the scanning line 18a is covered by the cap layer 81 as is the gate electrode layer 80.

Further, in reality, an alignment film is formed on the surfaces of the pixel electrode 19 and the fourth bank B4 to control the initial alignment state of the liquid crystal, and a retarder and a polarizer are provided on the outer surface of the glass substrate P to control the polarization state of the light incident on the liquid crystal layer. Also, a back light, which is used as an illumination means for a transmission-type or transreflective-type liquid crystal display device, is provided on the outside (the rear surface side of the panel) of the TFT array substrate 10.

The opposite substrate 25, although not illustrated in detail, is composed of a lamination including a color filter layer having the aligned coloring sections 22R, 22G, and 22B as shown in FIG. 3 and an opposite electrode made of a flat solid translucent conductive film on the inner surface side (the surface opposite from the TFT array substrate) of a substrate similar to the glass substrate P. Further, an alignment film similar to the TFT array substrate is formed on the opposite electrode, and, when necessary, a retarder and a polarizer are provided on the outer surface of the substrate.

Further, the liquid crystal layer sealed between the TFT array substrate 10 and the opposite substrate 25 is composed essentially of liquid crystal molecules. As the liquid crystal molecules constituting this liquid crystal layer, any liquid crystal molecules such as those of nematic liquid crystal or smectic liquid crystal may be used on condition that they are alignable. For a TN type liquid crystal panel, however, molecules constituting the nematic liquid crystal is preferable, such as the molecules of: phenyl cyclohexane derivative liquid crystal, biphenyl derivative liquid crystal, biphenyl cyclohexane derivative liquid crystal, terphenyl derivative liquid crystal, phenyl ether derivative liquid crystal, phenyl ester derivative liquid crystal, bicyclohexane derivative liquid crystal, azomethine derivative liquid crystal, azoxy derivative liquid crystal, pyrimidine derivative liquid crystal, dioxane derivative liquid crystal, and cubane derivative liquid crystal.

The liquid crystal display device 100 of the embodiment having the above structure is capable of performing a given gradation display by modulating the light emitted from the back light in the liquid crystal layer whose alignment state is controlled by the applied voltage. Further, because each dot is provided with the coloring sections 22R, 22G, and 22B, any given color display can be performed per each pixel by mixing lights of the three primary colors (R, G, and B).

Thin Film Transistor Manufacturing Method

Based on the method for manufacturing the TFT 60, one working example of the pixel electrode manufacturing method of one embodiment of the invention will now be described. The TFT 60 is formed by patterning the gate electrode layer 80, the source electrode 34, the drain electrode 35, and the pixel electrode 19 by the liquid ejection method using the banks.

Liquid Ejection Apparatus

First, the liquid ejection apparatus used in the manufacturing method of the present embodiment will be described. In this manufacturing method, each of the elements constituting the thin film transistor is formed by ejecting droplets of ink (functional liquid) containing the conductive microparticles and other functional materials from the nozzles of the liquid ejection head provided on the liquid ejection apparatus. The liquid ejection apparatus used in the embodiment may employ the structure as shown in FIG. 5.

Figure 5A:
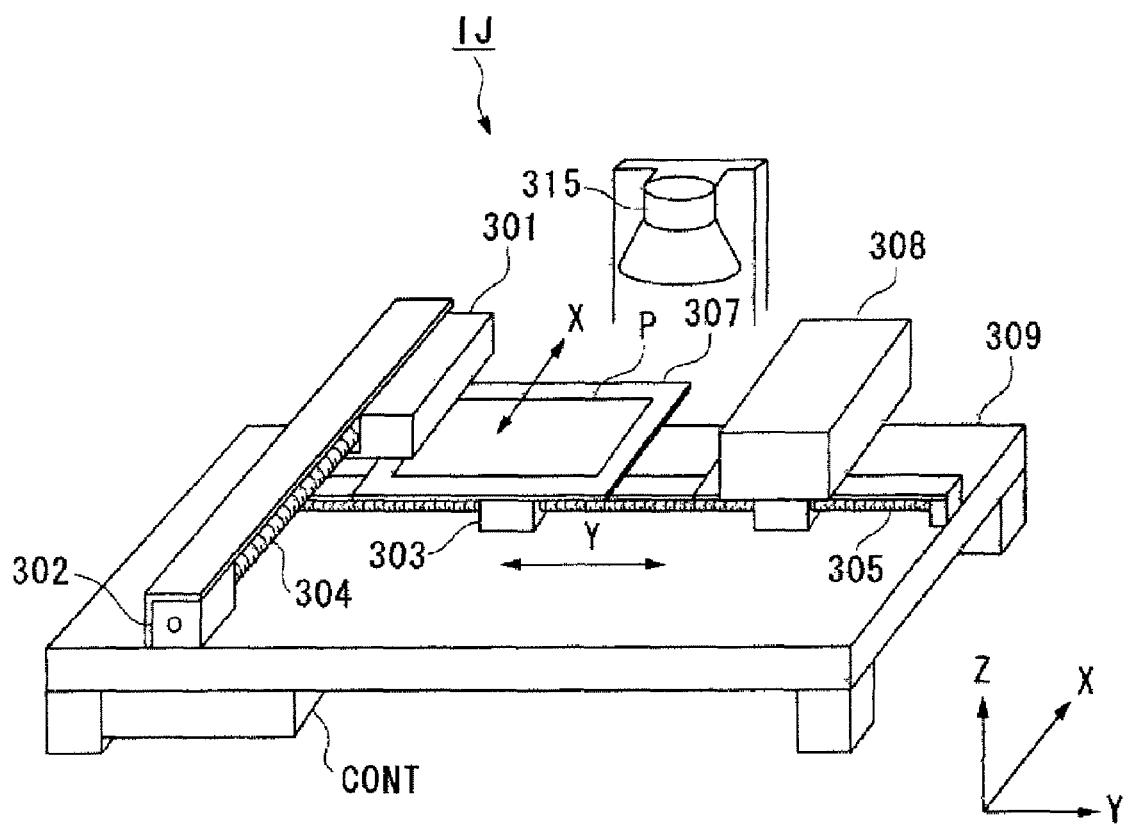
FIG. 5A is a diagram showing one example of a liquid ejection apparatus.

FIG. 5A is a perspective diagram showing a rough structure of a liquid ejection apparatus IJ used in the embodiment.

The liquid ejection apparatus IJ includes: a liquid ejection head 301, an X-axis direction drive axis 304, a Y-axis direction guide axis 305, a control device CONT, a stage 307, a cleaning mechanism 308, a base 309, and a heater 315.

The stage 307 supports the substrate P, on which the ink (the functional liquid) is provided from this liquid ejection apparatus IJ, and includes a fixing mechanism (not shown) fixing the substrate P at a reference position.

The liquid ejection head 301 is a multi-nozzle type liquid ejection head with a plurality of ejection nozzles, whose longitudinal direction matches with the Y-axis direction. The plurality of ejection nozzles are aligned having a fixed gap therebetween in the Y-axis direction on the lower surface of the liquid ejection head 301. The ejection nozzles of the liquid ejection head 301 eject the ink (the functional liquid) towards the substrate P supported by the stage 307.

The X-axis direction drive axis 304 is connected to an X-axis direction drive motor 302. The X-axis direction drive motor 302 is a stepping motor or the like and rotates the X-axis direction drive axis 304 upon supply of a drive signal for the X-axis direction from the control device CONT. When the X-axis direction drive axis 304 rotates, the liquid ejection head 301 moves in the X-axis direction.

The Y-axis direction guide axis 305 is fixed so as not to move against the base 309. The stage 307 has the Y-axis direction drive motor 303. The Y-axis direction drive motor 303 is a stepping motor or the like and moves the stage 307 in the Y-axis direction upon supply of a drive signal for the Y-axis direction from the control device CONT.

The control device CONT supplies a voltage for controlling the droplet ejection to the liquid ejection head 301. Further, the control device CONT supplies a drive pulse signal to the X-axis direction drive motor 302 to control the movement of the liquid ejection head 301 in the X-axis direction and a drive pulse signal to the Y-axis direction drive motor 303 to control the movement of the stage 307 in the Y-axis direction.

The cleaning mechanism 308 is for cleaning the liquid ejection head 301. The cleaning mechanism 308 is equipped with a drive motor (not shown) in the Y-axis direction. Driven by the drive motor (not shown) in the Y-axis direction, the cleaning mechanism moves along the Y-axis direction guide axis 305. The movement of the cleaning mechanism 308 is also controlled by the control device CONT.

The heater 315 is a means to heat the substrate P by lamp annealing, in this case, and to evaporate and dry the solvent contained in the liquid material coated on the substrate P. The input and interruption of the power source of this heater 315 are also controlled by the control device CONT.

The liquid ejection apparatus IJ ejects the droplets towards the substrate P while scanning the liquid ejection head 301 and the stage 307 supporting the substrate P in a relative manner. In the descriptions hereafter, the X-axis direction is referred to as a scanning direction, and the Y-axis direction is referred to as a non-scanning direction. Thus, the ejection nozzles of the liquid ejection head 301 are aligned having the fixed gap therebetween in the Y-direction which is the non-scanning direction. Additionally, although the liquid ejection head 301 is disposed at right angles to the moving direction of the substrate P in FIG. 5A, the liquid ejection head 301 may intersect the moving direction of the substrate P by adjusting the angle of the liquid ejection head 301. Consequently, the pitch between the nozzles can be adjusted by adjusting the angles of the liquid ejection head 301. Also, the distance between the substrate P and the nozzle surface may be adjusted as desired.

Figure 5B:
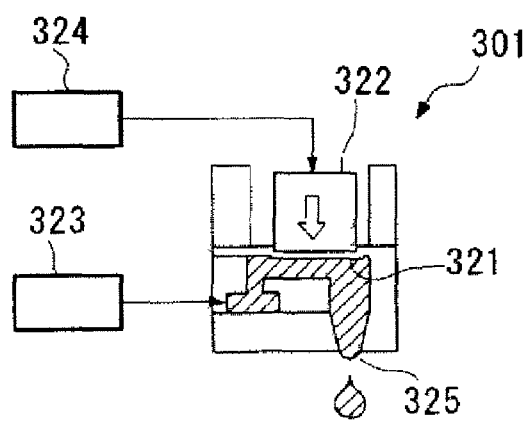
FIG. 5B is an outline of an ejection head.

FIG. 5B is a rough diagram of the structure of the liquid ejection head, explaining the principle of ink ejection by a piezo system.

In FIG. 5B, a piezoelectric element 322 is disposed adjacent to a liquid chamber 321 housing the ink (the functional liquid). The ink is supplied to the liquid chamber 321 via an ink supply system 323 having a material tank housing the ink. The piezoelectric element 322 is connected to a drive circuit 324 so that voltage is applied to the piezoelectric element 322 via this drive circuit 324, thereby deforming the piezoelectric element 322 to elastically deform the liquid chamber 321. As the inner volume changes by this elastic deformation of the liquid chamber 321, the liquid material is ejected from a nozzle 325.

In this case, the amount of distortion of the piezoelectric element 322 can be controlled by changing the values of the applied voltage. Also, by changing the frequencies of the applied voltage, the speed of distortion of the piezoelectric element 322 can be controlled. The liquid ejection by the piezo system has an advantage that, because it does not add heat to the material, it does not readily affect the composition of the material.

Ink (Functional Liquid)

Pertinent to the manufacturing method of the embodiment, the ink (the functional liquid) used to form conductive patterns such as the gate electrode layer 80, the source electrode 34, and the drain electrode 35 will now be described.

The ink (the functional liquid) for the conductive patterns used in the embodiment is composed of a dispersion liquid containing conductive microparticles, or a precursor thereof, dispersed in a dispersion medium. For example, the conductive microparticles are: metal microparticles containing gold, silver, cupper, palladium, aluminum, titanium, tungsten, manganese, niobium, nickel, etc.; precursors, alloys, or oxides of these metals; and transparent conductive microparticles such as conductive polymer and indium tin oxide.

In particular, when forming the transparent conductive film such as the pixel electrode 19 as will be described hereafter, transparent conductive microparticles composed of indium tin oxide (ITO), indium zinc oxide, or oxide of indium, tin, zinc, or the like are used.

These conductive microparticles (including the transparent conductive microparticles) can be used by coating the surfaces of the conductive microparticles with an organic matter or the like in order to improve their dispersion. The particle diameter of the conductive microparticle is preferably between 1 nm and 0.1 μm. If the diameter is larger than 0.1 μm, the nozzles of the liquid ejection head 301 may clog, and the density of the obtained film may be decreased. Further, if the diameter is smaller than 1 nm, the volume ratio of the coating agent to the conductive microparticles becomes large, and the proportion of the organic matter to the resultant film becomes too large.

The dispersion medium is not limited to any particular dispersion medium provided that it can disperse the above-referenced conductive microparticles and does not aggregate. For example, it can be: water; alcohol such as methanol, ethanol, propanol, butanol, or the like; a hydrocarbon compound such as n-heptane, n-octane, decane, dodecane, tetradecane, toluene, xylene, cymene, durene, indene, dipentene, tetrahydronaphthalene, decahydronaphthalene, cyclohexyl benzene, or the like; an ether compound such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1,2-dimethoxyethane, bis(2-methoxyl-ethyl)ether, p-dioxane, or the like; or a polar compound such as propylene carbonate, γ-butyrolactone, n-methyl-2-pyrrolidone, dimethyl formaldehyde, dimethyl sulfoxide, cyclohexanone, or the like. Among these, water, alcohol, a hydrocarbon compound, or an ether compound is preferable in view of dispersibility of the microparticles, stability of the dispersion liquid, and applicability to the liquid ejection method (an ink jet method). More preferably, the dispersion medium may be water or a hydrocarbon compound.

It is preferable that the surface tension of the dispersion liquid of the referenced conductive microparticles is between 0.02 N/m and 0.07 N/m. When ejecting liquid by the ink jet method, if the surface tension is less than 0.02 N/m, wettability of the ink compound to the nozzle surface increases, causing the liquid body to easily fly and curve, while, if the surface tension exceeds 0.07 N/m, the meniscus configuration at the tip of the nozzle is unstable, making it difficult to control the ejection amount and timing of the ejection. In order to control the surface tension, a trace of fluorine, silicone, or nonionic surface tension regulator, for example, may be added to the dispersion liquid in a range that does not greatly reduce the contact angle of the dispersion liquid to the substrate. The nonionic surface tension regulator enhances wettability of the liquid to the substrate, improves leveling property of the film, and prevents occurrence of minute unevenness or the like of the film. The surface tension regulator may include, if necessary, an organic compound such as alcohol, ether, ester, ketone, or the like.

The viscosity of the dispersion liquid is preferably between 1 mPa·s and 50 mPa·s. When ejecting the liquid material as droplets by the ink jet method, if the viscosity is less than 1 mPa·s, an area around the nozzle is readily contaminated by the ink outflow, and if the viscosity is larger than 50 mPa·s, the clogging of the nozzle hole occurs more frequently, making it difficult to smoothly eject the droplets and, thereby, decreasing the amount of the droplets ejected.

Additionally, although there are no particular formation conditions for the first, second, third, and fourth banks B1, B2, B3, and B4, a polysilazane solution may be favorably used as the formation material. This polysilazane solution consists mainly of polysilazane, and a photosensitive polysilazane solution containing polysilazane and a photoacid generating agent is used, for example. This photosensitive polysilazane solution comes to act as a positive-type resist and can be patterned directly by exposure and development processes. Such a photosensitive polysilazane may be exemplified in JP-A-2002-72504, for example. Further, the photoacid generating agent contained in this photosensitive polysilazane as disclosed in JP-A-2002-72504 is also used in the embodiment.

When this polysilazane is the polymethylsilazane expressed by the chemical formula 1 below, the polymethylsilazane is, as will be described, humidified for partial hydrolization, as expressed by the chemical formula 2 or 3, and then treated with heat at below 3,500° C. for condensation to give polymethylsiloxane [—$(SiCH_3O_{1.5})n$—] as expressed by the chemical formulae 4 through 6. Further, although not expressed in the formulae, when polymethylsiloxane is treated with heat at 350° C. or more, elimination of methyl groups in the side chains takes place, and when treated with heat particularly at 400° C. to 450° C., the methyl groups in the side chains are substantially eliminated to give polysiloxane. Additionally, in order to explain the reaction mechanism, the chemical formulae 2 through 6 are simplified so as to express only the basic constitution unit (repeating unit) in the compound.

Since thus-formed polymethylsiloxane or polysiloxane includes the inorganic polysiloxane as the skelton, it is sufficiently denser than a metal layer that is formed by being disposed by the liquid ejection method and then calcined. Consequently, the resultant layer (film) surface also has a good flatness. Also, since the resultant layer has high resistivity against heating, it is suitable as a material for the banks.

$—(SiCH_3(NH)_{1.5})n—$  Chemical formula 1:

$SiCH_3(NH)_{1.5}+H_2O \rightarrow SiCH_3(NH)(OH)+0.5NH_3$  Chemical formula 2:

$SiCH_3(NH)_{1.5}+2H_2O \rightarrow SiCH_3(NH)_{0.5}(OH)_2+NH_3$  Chemical formula 3:

$SiCH_3(NH)(OH)+SiCH_3(NH)(OH)+ \\ H_2O \rightarrow 2SiCH_3O_{1.5}+2NH_3$  Chemical formula 4:

$SiCH_3(NH)(OH)+SiCH_3(NH)_{0.5}(OH)_2 \\ \rightarrow 2SiCH_3O_{1.5}+1.5NH_3$  Chemical formula 5:

$SiCH_3(NH)_{0.5}(OH)_2+SiCH_3(NH)_{0.5}(OH)_2 \\ \rightarrow 2SiCH_3O_{1.5}+NH_3+H_2O$  Chemical formula 6:

In the embodiments of the invention, it is not necessary to always use the polysilazane solution as the material to form the first, second, third, and fourth banks B1, B2, B3, and B4, and the conventionally well-known organic resist may be used. Further, it is possible to use different materials for forming each of the banks. For example, part of each bank may be formed using the polysilazane solution, and the other part may be formed using the organic resist.

TFT Array Substrate Manufacturing Method

With reference to FIGS. 6 through 9, processes of manufacturing the TFT array substrate 10, including the method for manufacturing the TFT 60, will be described hereafter. FIGS. 6 through 9 show cross-sectional diagrams to explain a series of processes of the formation method of the embodiment.

Electrode Formation Process

As shown in FIGS. 6A through 6D, the glass substrate P made of non-alkali glass or the like is prepared as the base. After forming the first bank B1 on one surface of the glass substrate P, specified ink (a functional liquid) is dropped towards an aperture 30 formed in this first bank B1 to form the gate electrode layer 80 inside the aperture 30. This process of forming the gate electrode includes a bank formation process, a liquid repellency treatment process, a first electrode layer formation process, a second electrode layer formation process, and a calcination process.

First Bank Formation Process

Figure 6A:
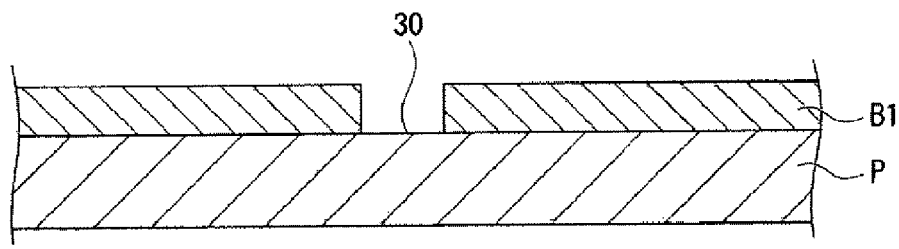
FIGS. 6A through 6D are cross-sectional diagrams to explain processes of manufacturing a thin film transistor.

First, in order to form the gate electrode layer 80 (and the scanning lines 18a) in a predetermined pattern on the glass substrate, the first bank B1 having the aperture 30 in a predetermined pattern is formed on the glass substrate P as shown in FIG. 6A. This first bank B is a partitioning member to planarly partition the substrate surface. To form this bank, a given method such as photolithography or printing can be used. For example, when using photolithography, a photosensitive material layer is formed by applying an organic photosensitive material such as acrylic resin by use of such a method as spin coating, spray coating, roll coating, dye coating, or dip coating so as to match with the height of the bank formed on the glass substrate P. Then, the photosensitive material layer is irradiated with ultraviolet rays in compliance with a desired bank configuration to form the first bank B1 having the aperture 30 used for the gate electrode layer.

Further, the first bank B1 may be formed using the photosensitive polysilazane solution, which may be applied by spin coating or the like, subjected to the exposure and development processes and, then, to the calcination process. Alternatively, the polysilazane solution may be selectively disposed by the liquid ejection method and then calcined and patterned into the bank configuration directly.

Liquid Repellency Treatment Process

Next, the first bank B1 is subjected to the liquid repellency treatment process to give liquid repellency to its surface A plasma treatment method (a $CF_4$ plasma treatment method) may be employed in the liquid repellency treatment process, in which tetrafluoromethane may used in the atmosphere as the treatment gas, for example. The conditions for the $CF_4$ plasma treatment are: plasma power at 50 kW-1,000 kW; tetrafluoromethane gas flow at 50 ml/min-100 ml/min; substrate transfer speed against plasma discharge electrode at 0.5 mm/sec-1,020 mm/sec; and substrate temperature at 70° C.-90° C., for example. The treatment gas is not limited to tetrafluoromethane (carbon tetrafluoride) but may be other fluorocarbon gas.

By carrying out such a liquid repellency treatment process, a fluorine group is introduced to the alkyl group and other constituents composing the first bank B1, and high repellency is given to the first bank B1.

Further, in order to clean the surface of the glass substrate P exposed at the bottom surface of the aperture 30, it is desirable to subject the surface of the substrate P to an ashing treatment with $O_2$ plasma or to a UV (ultraviolet) irradiation treatment prior to the liquid repellency treatment process. These treatments can remove the residues of the bank on the glass substrate P surface, widen the difference between the contact angle of the droplet to the first bank B1 that underwent the liquid repellency process and the contact angle of the droplet to the surface of the glass substrate P, and precisely enclose the droplet disposed in the process hereafter inside the aperture 30. Further, if the first bank B1 is made of acrylic resin or polyimide resin, it is desirable to subject the first bank B1 to $O_2$ ashing prior to the $CF_4$ plasma treatment, because, if the first bank B1 is exposed to $O_2$ plasma prior to the $CF_4$ plasma treatment, it is characteristic of the first bank B1 to become more easily fluorinated (liquid repellent).

More specifically, the referenced $O_2$ ashing treatment is conducted by irradiating the substrate P with oxygen in a plasma state from the plasma discharge electrode. The treatment conditions are: plasma power at 50 W-1,000 W; oxygen gas flow at 50 ml/min 100 ml/min; substrate P transfer speed against plasma discharge electrode at 0.510 mm/sec-10 mm/sec; and substrate temperature at 70° C.-90° C., for example.

The liquid repellency treatment process (the $CF_4$ plasma treatment) against the first bank B1 somewhat affects the substrate P surface made lyophilic by the described residue removal process. However, if the substrate P is made particularly of glass or the like, the fluorine group is not readily introduced by the liquid repellency treatment process, and, thus, the lyophililc property that is, the wettability, of the substrate P is not substantially damaged. Further, the liquid repellency treatment of the first bank B1 may be omitted if the first bank B1 is formed using a material having liquid repellency (e.g., fluorine-containing resin material).

Gate Electrode Layer Formation Process

Next, a gate electrode layer-forming ink (not shown) is dropped towards the aperture 30 from the liquid ejection head 301 of the liquid ejection apparatus IJ. In this process, Ag (silver) is used as the conductive microparticles, and ink using diethyleneglycol diethyl ether as the solvent (the dispersion medium) is ejected and disposed. Since the surface of the first bank B1 is made liquid repellent and the substrate surface at the bottom part of the aperture 30 is made lyophilic, part of the ejected droplet that lands on the first bank B1 is repelled at the bank surface and slips into the aperture 30.

After the droplets made of the electrode forming ink are ejected, a drying process is conducted to remove the solvent, if necessary. The drying process can be carried out by heating the substrate P with a common hot plate, an electric furnace, or the like. In the embodiment, the heating is conducted at 180° C. for about 60 min, for example. This heating does not have to be conducted in the air atmosphere but can be conducted in nitrogen gas atmosphere, for example.

Figure 6B:
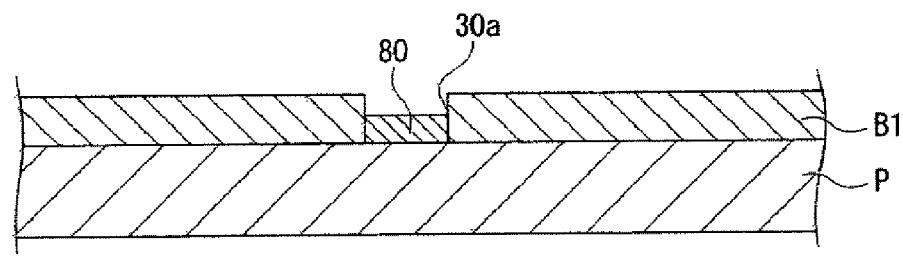

Further, the drying process can be carried out by lamp annealing. The light source used for the lamp annealing is not particularly limited; however, a light source such as infrared lamp, xenon lamp, YAG laser, argon laser, carbon dioxide laser, or excimer laser such as XeF, XeCl, XeBr, KrF, KrCl, ArF, or ArCl may be used. Although these light sources are generally used in the range of 10 W-5,000 W output, the range of 100 W 1,000 W is sufficient in the embodiment. By carrying out this intermediate drying process, the solid gate electrode layer 80 as shown in FIG. 6B is formed.

Cap Layer Formation Process

Next, cap layer-forming ink (not shown) is disposed in the aperture 30 of the first bank B1 by the liquid ejection method using the liquid ejection apparatus. In this process, nickel (Ni) is used as the conductive microparticles, and ink (liquid material) using diethanolamine as the solvent (the dispersion medium) is ejected and disposed. Since the surface of the first bank 131 is made liquid repellent, even if the ejected droplet partially lands on the first bank B1, it is repelled at the bank surface and slips into the aperture 30. However, because the surface of a first electrode layer 80a formed in advance inside the aperture 30 does not necessarily have a high lyophilic property against the ink dropped in this process, an intermediate layer may be formed on the gate electrode layer 80 to improve wettability of the ink prior to dropping of the ink. This intermediate layer is suitably selected depending on the type of the dispersion medium constituting the ink. If the ink uses an aqueous dispersion medium as in the embodiment, an intermediate layer made of titanium oxide, for example, can have very high wettability at the surface.

After the droplets are ejected, a drying process is conducted to remove the solvent, if necessary. The drying process can be carried out by heating the substrate P with a common hot plate, an electric furnace, or the like. The condition of this process is a heating temperature at 180° C. for about 60 min, for example. This heating, also, does not have to be conducted in the air atmosphere but can be conducted in nitrogen gas atmosphere, for example.

Further, this drying process can be carried out by lamp annealing. The light source used for the lamp annealing may be the light source mentioned in the previous intermediate drying process subsequent to the first electrode layer formation process. The output at the time of heating may be in the same range of 100 W-1,000 W. By carrying out this intermediate drying process, the solid cap layer 81 is formed on the gate electrode layer 80 as shown in FIG. 6B.

Calcination Process

Complete removal of the dispersion medium is required for the dried film that underwent the ejection process so as to increase the electric contact among the conductive microparticles. Also, if the surfaces of the conductive microparticles are coated with a coating agent such as an organic matter in order to raise dispersibility of the conductive microparticles in the liquid, it is also necessary to remove this coating agent. Thus, the substrate that underwent the ejection process is subjected to a heat and/or photo treatment.

This heat and/or photo treatment is generally conducted in the air atmosphere. However, if necessary, it can be conducted in the atmosphere of inert gas such as nitrogen, argon, helium, or the like. The treatment temperature in the heat and/or photo treatment is determined depending on the boiling point (vapor pressure) of the dispersion medium, type and pressure of the atmospheric gas, thermal behavior such as dispersibility and oxidation property of the microparticles, presence or absence of the coating agent and the amount thereof heat resistant temperature of the base material, and so on. In this situation, also, the calcining temperature can be set at 250° C. or less since the first electrode layer 80$a$ and a second electrode layer 80$b$ are formed using the aforementioned materials.

However, in this process, the semiconductor layer is not yet formed on the substrate P. It is therefore possible to raise the calcining temperature to be, for example, 250° C. or more to about 300° C., which is within the range of the heat resistant temperature of the first bank B1, so that the metal wiring having even higher conductivity can be produced. More specifically, if the first bank B1 made of the inorganic layer having polysiloxane as the skelton is formed by use of the polysilazane solution as described, the calcining temperature can be 250° C. or more.

Figure 6C:
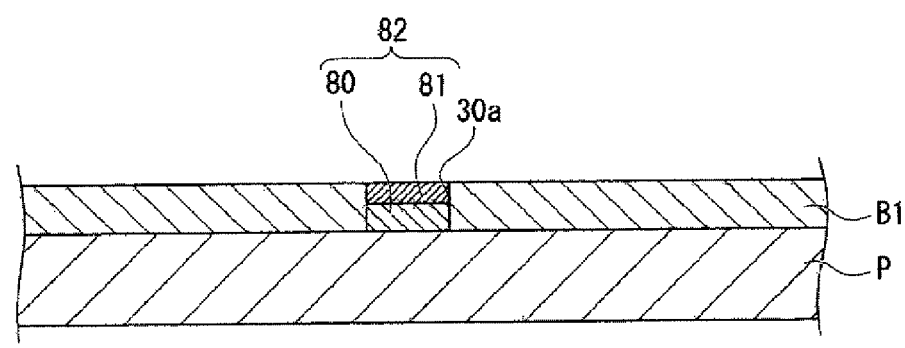

Through these processes, the dried film that underwent the ejecting process obtains the electric contact among the microparticles and is converted into the conductive film. Consequently, a conductive pattern 82 made of a laminate including the gate electrode layer 80 and the cap layer 81 is produced as shown in FIG. 6C. Also, as shown in FIG. 3, the scanning lines 18$a$ integrated with the gate electrode layer 80 are formed on the glass substrate P through the described processes.

In the processes above, the gate electrode layer 80$a$ composed of Ag and the cap layer 80$b$ composed of Ni are formed, and, using the laminate including these gate electrode layer 80 and cap layer 81, the conductive pattern 82 is formed. However, the gate electrode layer 80 may be formed using a metal other than Ag, such as Cu or Al, or an alloy mainly consisting these metals. Further, the cap layer 81 may be formed using a metal other than Ni, such as Ti, W, or Mn, or an alloy mainly consisting these metals. Furthermore, Mn, Ti, W, or the like that acts as an adhering layer may be formed as the first layer, and Ag, Cu, Al, or the like that acts as the main conductive layer may be formed as the second layer. Further, the conductive pattern 82 that acts as the gate electrodes may be formed by laminating more than three electrode layers or may certainly be formed by a single electrode layer.

Second Bank Formation Process

Next, the ink (the polysilazane solution) is ejected and disposed from the liquid ejection head 301 on a predetermined position on the first bank B1. For the ink made of the polysilazane solution, the ink mainly consisting the described polysilazane is used. Further, the predetermined position on the first bank B1 means a position at which the region for forming the source electrodes 34 and the drain electrodes 35 is partitioned, and is a region where the second bank B2 is formed. In this process, because the ejection of the polysilazane solution to the predetermined position is conducted by the liquid ejection method using the liquid ejection head 301, the polysilazane solution can be applied selectively to the desired position through the series of processes.

Once the polysilazane solution is thus disposed on the first bank B1, the obtained polysilazane thin film is prebaked, if necessary, at 110° C. for about one minute on a hot plate, for example.

Figure 6D:
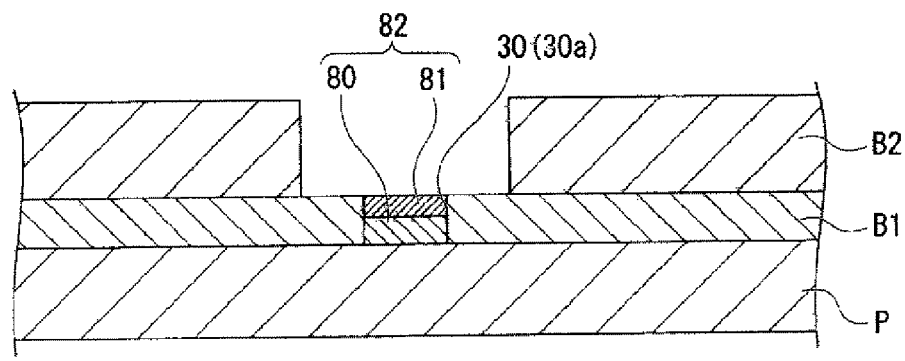

Then, by conducting the calcination process at 300° C. for about 60 min, for example, the second bank B2 is formed as shown in FIG. 6D. In this process, if the referenced photosensitive polysilazane solution containing polysilazane and a photoacid producing agent is used as the polysilazane solution as the ink, the whole-surface exposure process and the humidifying process may be conducted prior to the calcination process. By carrying out these processes, polysilazane as expressed by the chemical formula 1 can be readily turned into polymethylsiloxane as expressed by the chemical formulae 4 through 6. Because the formed second bank B2 includes the inorganic polysiloxane as the skelton, it has an outstanding heat resistance compared to a bank made of, for example, an organic material.

Gate Insulation Film Formation Process

Figure 7A:
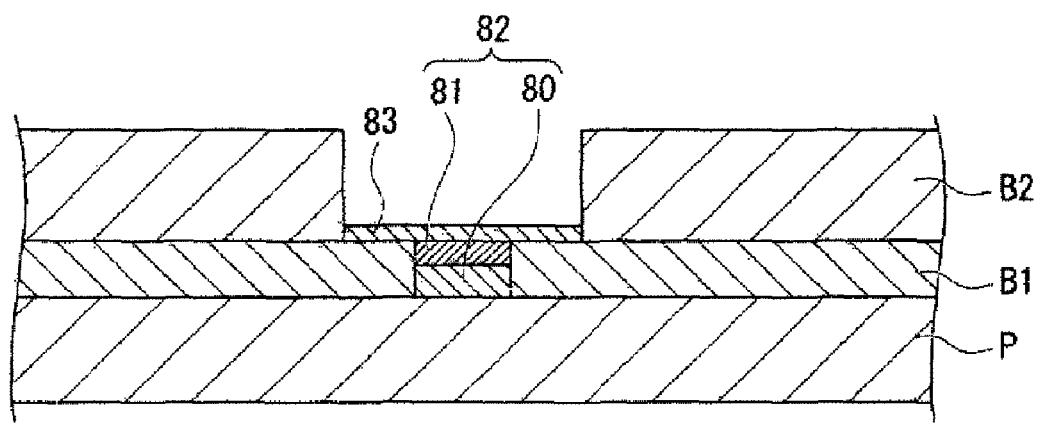

As shown in FIG. 7A, a gate insulation film 83 made of silicon nitride is formed in a region partitioned by the second bank B2. This gate insulation film 83 can be formed by forming film on the whole surface by the plasma CVD method, for example, and then by suitably patterning the film by photolithography. The material gas used in the CVD process is preferably a mixed gas of minosilane and dinitrogen monoxide, tetraethoxysilane (TEOS: $Si(OC_2H_5)_4$) and oxygen, or disilane and ammonia, for example. The gate insulation film 83 to be formed has a film thickness of about 150 nm-400 nm. Additionally, it is not necessary to pattern the formed silicon nitride film, and the silicon nitride film may simply be on the second bank B2 as formed.

Semiconductor Layer Formation Process

Figure 7B:
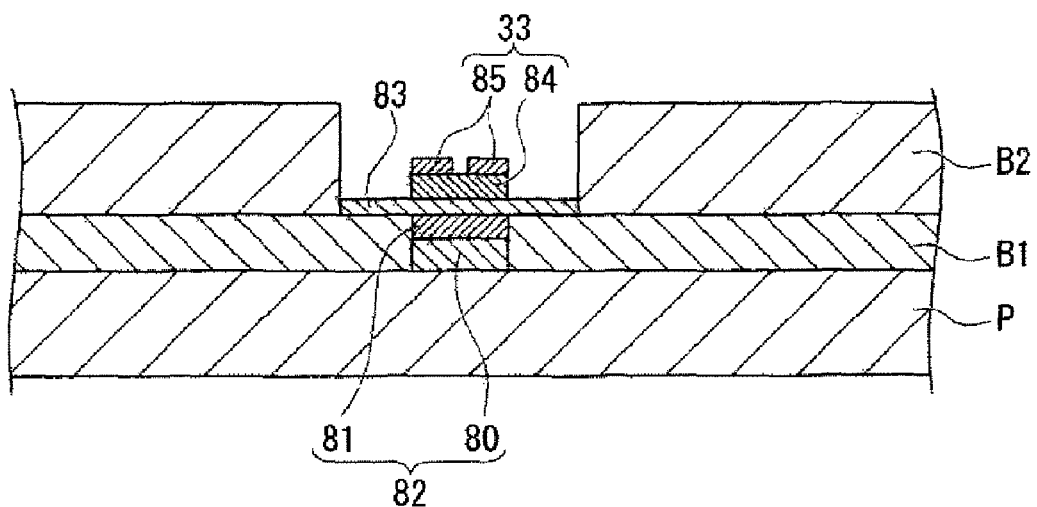

The semiconductor layer 33 as shown in FIG. 7B is formed on the gate insulation layer 83. This semiconductor layer 33 is formed on the entire surface of the substrate P having the gate insulation layer 83 formed thereon, by laminating an amorphous silicon film having a thickness of about 150 nm-250 nm and an $N^+$ silicon film having a thickness of about 50 nm-100 nm by the plasma CVD method or the like and, then, by patterning the layer into a predetermined configuration by photolithography. The material gas used in the amorphous silicon film formation process is preferably disilane or monosilane. The following $N^+$ silicon film formation process can be conducted by introducing the material gas for forming the $N^+$ silicon layer into a formation apparatus used when forming the referenced amorphous silicon film.

Thereafter, the amorphous silicon film and the $N^+$ silicon film are patterned into a configuration as shown in FIG. 7B by photolighography so that the semiconductor layer 33 of the laminated amorphous silicon layer 84 and $N^+$ silicon layer 85 in the predetermined configuration is produced on the gate insulation layer 83. To conduct the patterning, resist having a substantially recessed shape, similar to the sectional side shape of the semiconductor 33 as shown in the drawing, is selectively disposed on the surface of the $N^+$ silicon film, and etching is carried out using this resist as a mask. By such a patterning method, the $N^+$ silicon layer 85 is selectively removed at the region planarly overlapping with the gate electrode layer 80 and split into two regions. These split $N^+$ silicon layers 85 and 85 each form a source contact region and a drain contact region.

Figure 8A:
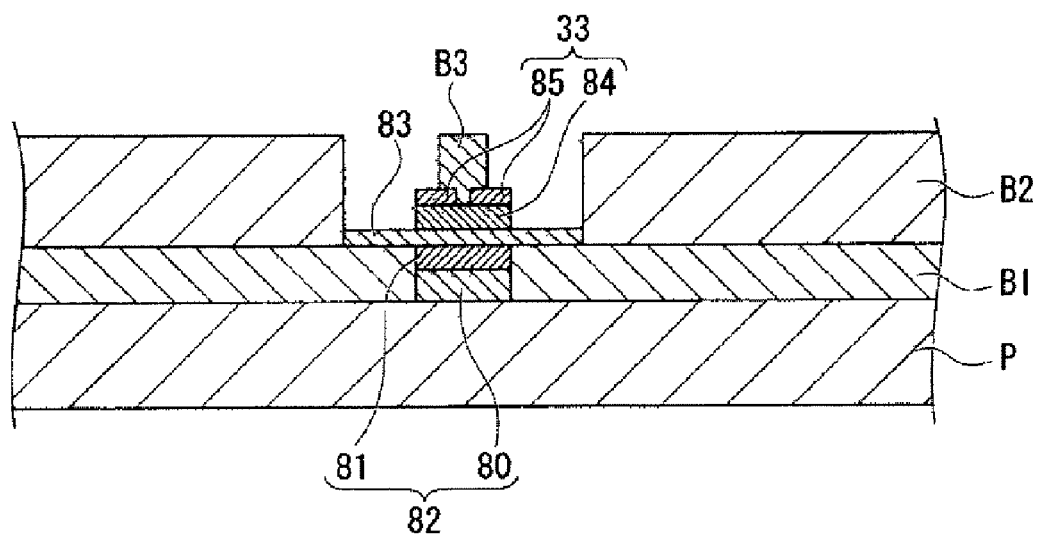
FIGS. 8A and 8B are cross-sectional diagrams to explain processes of manufacturing the thin film transistor

Next, as shown in FIG. 8A, the third bank B3 made of an insulation material is formed on the two split $N^+$ silicon layer 85 and 85, thereby also electrically splitting the two. Similarly to the case of the second bank B2, the third bank B3 is also formed by selectively ejecting and disposing the polysilazane solution (the ink) from the liquid ejection head 301, followed by the drying and calcination treatments. Thus formed third bank B3, together with the second bank B2, comes to partition the formation region of the source electrode 34 and the formation region of the drain electrode 35.

Electrode Formation Process

Now, the source electrode 34 and the drain electrode 35 as shown in FIG. 4 are formed on the glass substrate P with the semiconductor layer 33 formed thereon.

Liquid Repellency Treatment Process

First, the liquid repellency treatment process is conducted on the second and third banks B2 and B3 so as to give liquid repellency to the surfaces thereof. The plasma treatment method (the $CF_4$ plasma treatment method) can be employed in the liquid repellency treatment process, in which tetrafluoromethane is used as the treatment gas in the air atmosphere.

Electrode Film Formation Process

Thereafter, an ink (a functional liquid) for forming the source electrode 34 and the drain electrode 35 shown in FIG. 4 is applied to the region surrounded by the second and third banks B2 and B3 using the liquid ejection apparatus IJ. In this process, an ink using silver as the conductive microparticles and ethyleneglycol diethyl ether as the solvent (dispersion medium) is ejected. Once the droplets are ejected, the drying process is carried out to remove the dispersion medium, if necessary. The drying process can be carried out by heating the substrate P with a common hot plate, an electric furnace, or the like. In the embodiment, the heating is conducted at 180° C. for about 60 min, for example. This heating does not have to be conducted in the air atmosphere but can be conducted in $N_2$ atmosphere, for example.

Further, the drying process can be carried out by lamp annealing. The light source used for the lamp annealing may be the light source mentioned in the previous intermediate drying process subsequent to the first electrode layer formation process. The output at the time of heating can also be in the range of 100 W-1,000 W.

Calcination Process

Complete removal of the dispersion medium is required for the dried film that underwent the ejection process so as to increase the electric contact among the conductive microparticles. Also, if the surface of the conductive microparticles is coated with the coating agent such as the organic matter in order to raise dispersibility of the conductive microparticles, it is also necessary to remove this coating agent. Accordingly, the substrate that underwent the ejection process is subjected to the heat and/or photo treatment. This heat and/or photo treatment can be carried out under the same calcination process conditions as those in the formation of the gate electrode layer 80.

Figure 8B:
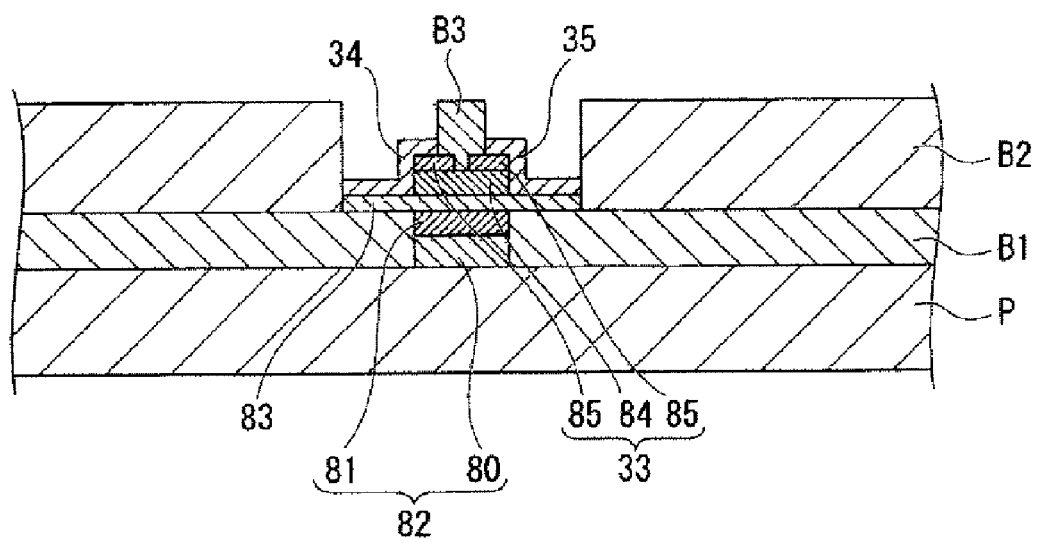

Through these processes, the dried film that underwent the ejection process obtains the electric contact among the microparticles and is converted into the conductive film. Consequently as shown in FIG. 8B, the source electrode 34 coupled and electrically connected with one of the $N^+$ silicon layers 85 and the drain electrode 35 coupled and electrically connected with the other $N^+$ silicon layer 85 are produced.

Thereafter, as shown in FIG. 9A, the insulation material 86 is disposed so as to fill a recessed part (an aperture), which is partitioned by the second and third banks B2 and B3 and which has the source electrode 34 and the drain electrode 35 formed therein.

Then, the contact hole 87 is formed in the insulation material 86 on the drain electrode 35 side.

Thereafter, the ink made of the polysilazane solution is ejected and disposed from the liquid ejection head 301 to a predetermined position on the second bank B2, the insulation material 86, and the third bank B3. For the ink made of the polysilazane solution, the ink mainly consisting the referenced polysilazane is used. Further, the mentioned predetermined position means a position at which the region for forming the pixel electrode 19 is partitioned and at which the fourth bank B4 is formed. In this process, because the ejection of the polysilazane solution to the predetermined position is conducted by the liquid ejection method using the liquid ejection head 301, the polysilazane solution can be applied selectively to the desired position through the series of processes.

When the polysilazane solution is thus disposed, the obtained polysilazane thin film is prebaked, if necessary, at 110° C. for about one minitue on a hot plate, for example.

Then, by conducting the calcination process at 3000° C. for about 60 min, for example, the fourth hank B4 is formed. In this process, if the photosensitive polysilazane solution containing the referenced polysilazane and the photoacid-producing agent is used as the polysilazane solution as the ink, the whole-surface exposure process and the humidifying process may be conducted prior to the calcination process. By carrying out these processes, polysilazane as expressed by the chemical formula 1 can be readily turned into polymethylsiloxane as expressed by the chemical formulae 4 through 6. Because thus-formed fourth bank B4 includes the inorganic polysiloxane as the skelton, it has an outstanding heat resistance compared to a bank made of, for example, an organic material. However, the fourth bank 84 may also not have to be formed using the polysilazane solution but be formed using the conventionally well-known organic material (organic resist).

Then, similarly to the case of the first bank B, the liquid repellency treatment process is conducted with the fourth bank B4 so that the surface thereof becomes liquid repellent.

Thereafter, a transparent ink (a first functional liquid), which is made of the aforementioned dispersion solution having the transparent conductive microparticles dispersed therein, is dropped from the liquid ejection head 301 of the liquid ejection apparatus IJ onto a region partitioned by the fourth hank B4. In the embodiment, the transparent ink may preferably be a dispersion solution having indium tin oxide (ITO) dispersed therein. Since the surface of the fourth bank B4 is made liquid repellent, even if the ejected droplet partially lands on the fourth bank B4, it is repelled at the bank surface and slips into the partitioned region. Additionally, in this process, it is desirable to selectively eject and dispose a predetermined amount of the transparent ink onto the aperture of the contact hole 87 so as to satisfactorily fill the transparent ink particularly into the contact hole 87.

When the transparent ink is applied into the fourth bank B4, the ink is let to dry naturally for about 10 min, for example. Then, the substrate P is placed into a calcination furnace to be heated at the temperature increase rate of 200° C./hr in the air atmosphere, for example, maintained at 550° C. for about 30 min, and then cooled down to room temperature at the temperature decrease rate of 200° C./hr. By carrying out this heating process (drying process), a first layer film 19c made of the transparent conductive microparticles is formed as shown in FIG. 9B. When the first layer film 19c is formed in this manner, many pores (not shown) are formed among the microparticles when seen microscopically, because the first layer film 19c is the aggregate of the transparent conductive microparticles.

Then, a second functional liquid containing a silicon compound is disposed onto the first layer film 19c by the liquid ejection method. More specifically, for the silicon compound, microparticles of a compound such as thermally decomposable siloxane, silicate, polysilazane, silicon alkoxide, or the like that has at least Si atoms and turns readily into an oxide by a heating process, as will be described hereafter, are used. For the second functional liquid, a dispersion solution dispersing the mentioned compound microparticles is used.

When such a second functional liquid is ejected and disposed onto the first layer film 19c, the disposed second functional liquid is heated at a temperature increase rate of 200° C./hr in nitrogen atmosphere, for example, maintained at 550° C. for about 30 min, and then cooled down to room temperature at the temperature decrease rate of 200° C./hr. By carrying out this heating process, the first layer film 19c and the second functional liquid are calcined together to produce the transparent conductive layer 19a composed of the first layer film 19c and the silicon oxide filling the pores in this first layer film as shown in FIG. 9C.

With this transparent conductive layer 19a, in particular, there are cases in which the second functional liquid does not permeate up to the bottom side of the first layer film 19c, and, as a result, the transparent conductive layer 19a may be formed by itself without having the pores at the bottom side of the first layer film 19c filled with the silicon oxide. However, even if the transparent conductive layer 19a of one embodiment of the invention may have such a structure that the first layer film 19c is formed by itself at the bottom side, the operational effect as will be described hereafter is exerted.

In the ejection and disposition of the second functional liquid, once the first layer film 19c and the second functional liquid are calcined together, the amount of the second functional liquid to be ejected is controlled so that the silicon oxide layer 19c made of the second functional is formed on the transparent conductive layer 19a.

Also, by suitably controlling the ejection amount of each of the first and second functional liquids, the first layer film 19c obtained upon the described drying process is 400 nm or less, and the silicon oxide layer 19b has a thickness between 10 nm or more and 100 nm or less.

If the thickness of the first layer film 19c is 400 nm or less, the obtained pixel electrode 19 can have good transparency.

Also, if the thickness of the silicon oxide layer 19b is between 10 nm or more and 100 nm or less, the decrease in transmittance of the obtained pixel electrode 19 can be suppressed, and the formation of capacitance can be prevented. If the thickness of the silicon oxide layer is below 10 nm, however, the flatness of the silicon oxide layer 19b decreases, and, thus, the transmittance may degrease. Also, if the thickness is more than 100 nm, the capacitance may be formed at this silicon oxide layer 19b. Therefore, by keeping the thickness within the reference range, both the transmission decrease and the capacitance formation can be suppressed.

As thus shown, by forming the transparent conductive layer 19a composed of the first layer film 19c and the silicon oxide filling the pores in this first layer film while forming the silicon oxide layer 19b made of the second functional liquid on the transparent conductive layer 19a, and by forming the pixel electrode 19 having the laminate including these transparent conductive layer 19a and the silicon oxide layer 19b, the TFT array substrate 10, which includes the TFT 60 formed on the inner surface side (the upper surface in the drawing) of the glass substrate P and the pixel electrode 19 of one embodiment of the invention, can be obtained.

According to the formation method of one embodiment of the invention, because the first and second functional liquids are successively disposed in the region partitioned by the fourth bank B4 by the ink ejection method, the pixel electrode 19 can be patterned and formed with precision despite the fineness of the pattern, provided that the bank B4 corresponding to a desired pixel electrode pattern is formed in advance.

Also, because the pixel electrode 19 is formed in the fourth bank B4, and the side edge surfaces of the pixel electrode 19, in particular, are covered by the bank B4, the changes in the conductivity of the pixel electrode 19 due to moisture absorption from the side edge surfaces can be suppressed without accompanying the transmittance decrease.

Further, because the pixel electrode 19 is formed by laminating the transparent conductive layer 19a and the silicon oxide layer 19b, in particular, and because the silicon oxide layer 19 has substantially the same transmittance as that of glass, the pixel electrode 19 itself also has the transmittance close to that of glass. Therefore, since a glass substrate is used for the substrate P, and, thus, the refractive index between the substrate P and the pixel electrode 19 is sufficiently small, for example, the electrooptical device can better perform the display if this particular pixel electrode 19 is used in the electrooptical device.

Furthermore, because the liquid crystal display device 100 having the described TFT array substrate 10 allows miniaturization of the pixel electrode 19, the display can be made more precise. Moreover, since the conductivity change in the pixel electrode 19 is suppressed without accompanying the transmittance decrease, the display can be stably performed.

Additionally, the invention can be applied not only to the liquid crystal display device 110 but also to various types of electrooptical devices. For example, organic electroluminescence display devices, plasma display devices, and the like can suitably employ the embodiments of the invention.

Electronic Apparatus

Figure 10:
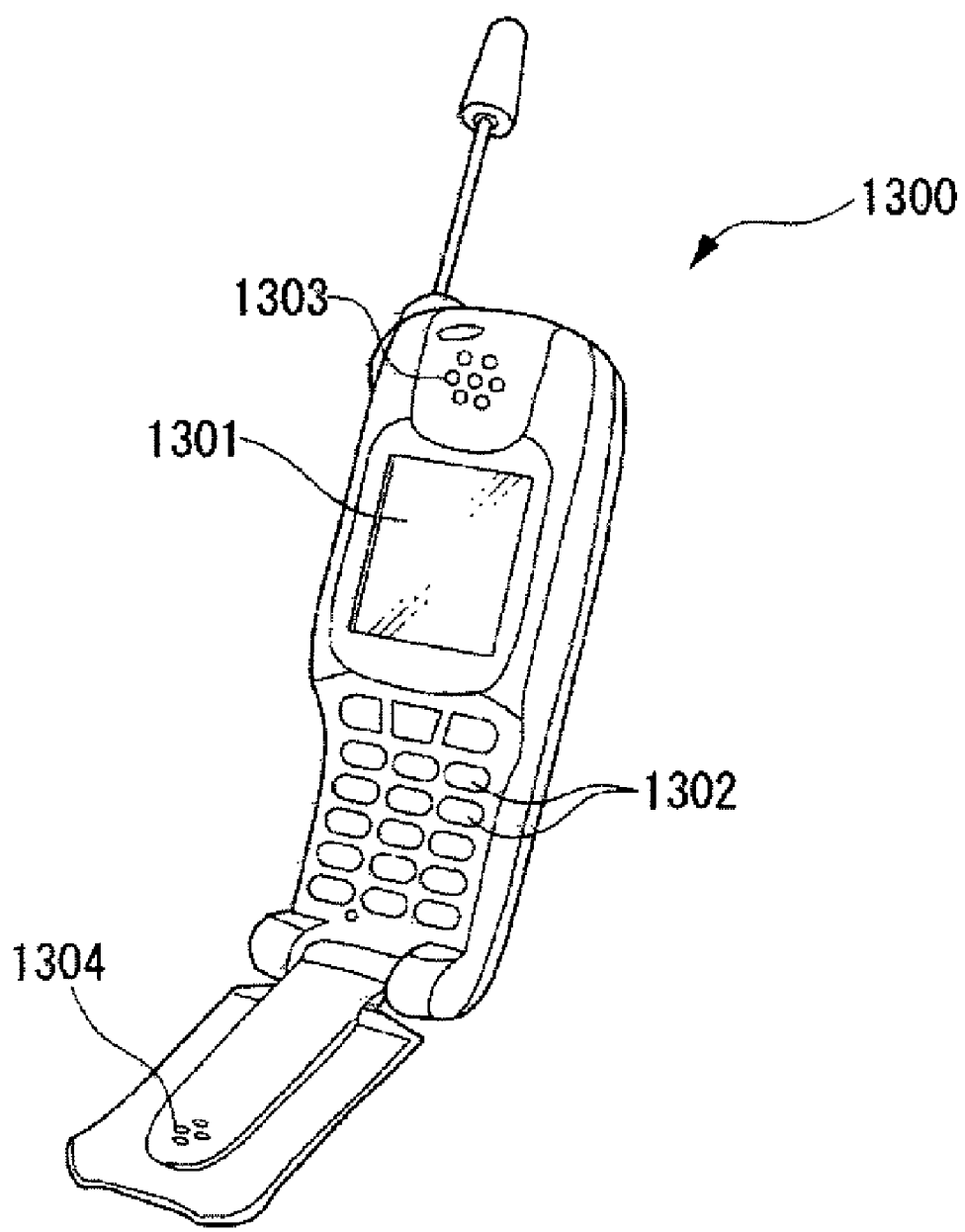
FIG. 10 is a perspective diagram showing the structure of one example of an electronic apparatus.

FIG. 10 is a perspective diagram showing one example of the electronic apparatus according to one embodiment of the invention. A cellular phone 1300 shown in the drawing includes a small-sized liquid crystal display device according to the embodiments of the invention as a display section 1301, a plurality of operation buttons 1302, a reception port 1303, and a transmission port 1304.

In addition, the electrooptical device of the aforementioned embodiment is not limited to the referenced cellular phone but can be suitably employed as an image display means for various equipment such as electronic books, personal computers, digital still cameras, video monitors, view-finder-type or direct-monitor-type videotape recorders, car navigation systems, pagers, electronic organizers, desk-top electronic calculators, word processors, workstations, TV telephones, POS terminals, and equipment provided with touch panels.

Because such an electrooptical device is capable of performing a fine and stable display, the electronic equipment using the electrooptical device is also capable of performing the fine and stable display.

What is claimed is:

1. A method for forming a pixel electrode on a substrate, comprising:
    forming a bank corresponding to a region for forming the pixel electrode on a substrate;
    disposing, by a liquid ejection method, a first functional liquid containing transparent conductive microparticles in the region partitioned by the bank;
    drying the first functional liquid to produce a first layer film;
    disposing, by a liquid ejection method, a second functional liquid containing a silicon compound onto the first layer film; and
    forming a pixel electrode made of a laminate that includes:
        a transparent conductive layer which is formed by calcining together the first layer film and the second functional liquid and is composed of the first layer film and silicon oxide filling a pore in the first layer film; and a silicon oxide layer formed on the transparent conductive layer.

2. The method for forming the pixel electrode according to claim 1, wherein the first layer film obtained by the drying process has a thickness of 400 nm or less.

3. The method for forming the pixel electrode according to claim 2, wherein the silicon oxide layer has a thickness of 10 nm or more and 100 nm or less.

4. The method for forming the pixel electrode according to claim 1, wherein a glass substrate is used as the substrate.

5. An electrooptical device comprising the pixel electrode formed by the formation method of claim 1.

6. An electronic apparatus comprising the electrooptical device of claim 5.

* * * * *